(12) United States Patent
Hu et al.

(10) Patent No.: US 10,665,675 B2
(45) Date of Patent: May 26, 2020

(54) HIGH DOSE ANTIMONY IMPLANT THROUGH SCREEN LAYER FOR N-TYPE BURIED LAYER INTEGRATION

(71) Applicant: TEXAS INSTRUMENTS INCORPORATED, Dallas, TX (US)

(72) Inventors: Binghua Hu, Plano, TX (US); Azghar H Khazi-Syed, Arlington, TX (US); Shariq Arshad, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/282,374

(22) Filed: Feb. 22, 2019

(65) Prior Publication Data
US 2019/0189751 A1   Jun. 20, 2019

Related U.S. Application Data

(62) Division of application No. 15/499,020, filed on Apr. 27, 2017, now Pat. No. 10,243,048.

(51) Int. Cl.
| | |
|---|---|
| H01L 29/10 | (2006.01) |
| H01L 27/088 | (2006.01) |
| H01L 21/74 | (2006.01) |
| H01L 21/265 | (2006.01) |
| H01L 21/225 | (2006.01) |
| H01L 21/02 | (2006.01) |
| H01L 21/762 | (2006.01) |
| H01L 21/3105 | (2006.01) |
| H01L 21/8234 | (2006.01) |
| H01L 21/306 | (2006.01) |
| H01L 29/06 | (2006.01) |

(Continued)

(52) U.S. Cl.
CPC .... *H01L 29/1083* (2013.01); *H01L 21/02164* (2013.01); *H01L 21/02236* (2013.01); *H01L 21/02238* (2013.01); *H01L 21/02255* (2013.01); *H01L 21/02532* (2013.01); *H01L 21/2253* (2013.01); *H01L 21/266* (2013.01); *H01L 21/2652* (2013.01); *H01L 21/30604* (2013.01); *H01L 21/31053* (2013.01); *H01L 21/74* (2013.01); *H01L 21/76224* (2013.01); *H01L 21/823437* (2013.01); *H01L 21/823481* (2013.01); *H01L 21/823493* (2013.01); *H01L 27/088* (2013.01); *H01L 29/0653* (2013.01); *H01L 29/66575* (2013.01)

(58) Field of Classification Search
CPC ....... H01L 21/74; H01L 27/088; H01L 29/10; H01L 29/108; H01L 29/1083
USPC ......................................................... 257/400
See application file for complete search history.

(56) References Cited

U.S. PATENT DOCUMENTS

| | | |
|---|---|---|
| 6,303,419 B1 | 10/2001 | Chang et al. |
| 6,432,791 B1 | 8/2002 | Hutter et al. |
| 7,435,659 B2 | 10/2008 | Hu et al. |

(Continued)

*Primary Examiner* — Fazli Erdem
(74) *Attorney, Agent, or Firm* — Andrew R. Ralston; Charles A. Brill; Frank D. Cimino (57) ABSTRACT

A microelectronic device includes a substrate comprising a semiconductor material having a top surface. An epitaxial layer is located on the top surface of the substrate. A doped buried layer is located within the semiconductor material, and the top surface has a surface recess over the buried layer. The surface recess has a maximum step height no greater than about 5 nanometers. A method of forming the microelectronic device is also disclosed.

16 Claims, 7 Drawing Sheets

(51) Int. Cl.
*H01L 21/266* (2006.01)
*H01L 29/66* (2006.01)

(56) References Cited

U.S. PATENT DOCUMENTS

| | | |
|---|---|---|
| 2004/0018705 A1 | 1/2004 | Colson et al. |
| 2006/0183283 A1 | 8/2006 | Mitros et al. |
| 2006/0194401 A1* | 8/2006 | Hu .................. G03F 9/7076 438/369 |
| 2006/0220179 A1 | 10/2006 | Wu et al. |
| 2007/0298579 A1* | 12/2007 | Hu .................. H01L 21/2253 438/377 |
| 2010/0032794 A1 | 2/2010 | Pendharkar et al. |
| 2012/0100680 A1 | 4/2012 | Chuang |
| 2013/0207210 A1 | 8/2013 | Edwards et al. |
| 2015/0179793 A1 | 6/2015 | Denison et al. |

* cited by examiner

HIGH DOSE ANTIMONY IMPLANT THROUGH SCREEN LAYER FOR N-TYPE BURIED LAYER INTEGRATION

CROSS-REFERENCE TO RELATED APPLICATIONS

Under 35 U.S.C. § 120, this continuation application claims the benefit of and priority to U.S. patent application Ser. No. 15/499,020, filed Apr. 27, 2017, the entirety of which is hereby incorporated herein by reference.

FIELD

This disclosure relates to the field of microelectronic devices. More particularly, this disclosure relates to buried layers in microelectronic devices.

BACKGROUND

A microelectronic device with analog components may have an n-type buried layer (NBL) doped with antimony (Sb). Antimony is commonly a preferred dopant for the NBL due to its low diffusion coefficient doping with antimony enables high dopant density (and hence low sheet resistance for the NBL) without diffusing into other components. The NBL is commonly formed by starting with a p-type silicon substrate, and growing a thick layer of thermal oxide, a few hundred nanometers thick, on the top surface of the substrate. A photoresist mask is patterned over the thick oxide, exposing the area for the NBL. The thick oxide is etched away in the area for the NBL, exposing the silicon, after which the photoresist mask is removed. Antimony is implanted into the silicon, with a high dose, for example over $1 \times 10^{15}$ cm$^{-2}$, to provide a desired low sheet resistance. The thick thermal oxide blocks the antimony from the substrate outside of the NBL area. Thick oxide is needed to block the antimony, because photoresist would harden during the implant at such a high dose, making it difficult to remove without damaging the exposed silicon surface in the NBL area. The thick oxide is left in place while additional thermal oxide, typically several hundred angstroms, is grown on the substrate, usually during a temperature ramp preceding an anneal/drive step. The additional thermal oxide is needed to reduce antimony escape during the anneal/drive. Antimony escape can undesirably reduce the dopant density in the NBL and might undesirably dope areas outside the NBL. Growing the additional thermal oxide with the thick oxide in place results in a recess, typically greater than 10 nanometers deep, in the top surface of the substrate, because the silicon in the implanted area is consumed by the oxide growth, while the silicon under the thick oxide is consumed at a much lower rate. The anneal/drive step anneals the substrate, and activates and diffuses the antimony deeper into the substrate, to form a part of the NBL. The oxide is subsequently removed from the top surface of the substrate, leaving the silicon recess over the NBL area. A p-type silicon epitaxial layer is grown on the substrate, typically three microns to ten microns thick. Antimony diffuses upward into the epitaxial layer as it is grown, but does not extend to the top surface of the epitaxial layer. The antimony in the substrate and in the epitaxial layer provide the NBL. The silicon recess is replicated in the top surface of the epitaxial layer. The silicon recess can reduce process latitude during subsequent formation of components in, or over, the epitaxial layer. In some cases, it may be impractical or too costly to fabricate some components because of the silicon recess.

SUMMARY

The present disclosure introduces a method for forming an n-type buried layer (NBL) in a microelectronic device. In one implementation, the disclosed method uses a uniform, thin screen layer in an antimony implant and subsequent anneal/drive operation. Advantageously, use of the uniform, thin screen layer produces a shallow silicon recess which may be compatible with subsequent formation of components in the microelectronic device.

A microelectronic device having an NBL is formed by providing a substrate which includes a semiconductor material at a top surface. A thin screen layer is formed on the top surface of the substrate. An implant mask is formed on the screen layer, exposing the screen layer in the NBL area. Antimony is implanted through the screen layer into the substrate; the implant mask blocks antimony from the substrate outside the NBL area. After the antimony is implanted, the implant mask is removed. The screen layer is left on the surface. The substrate is heated in an anneal/drive process which anneals implant damage in the substrate and diffuses the implanted antimony. Silicon dioxide is formed during the anneal/drive process by oxygen gas in the ambient, both in the NBL area and outside the NBL area. Slightly more silicon dioxide is formed in the NBL area, consuming more silicon there and so forming a shallow silicon recess. The additional silicon oxide and the screen layer are removed from the top surface of the substrate, and an epitaxial layer is grown on the top surface of the substrate. A structure for the microelectronic device is also disclosed.

DETAILED DESCRIPTION

The present disclosure is described with reference to the attached FIGURES. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

For the purposes of this disclosure, the term "lateral" is understood to refer to a direction parallel to a plane of the instant top surface of the microelectronic device or substrate. Similarly, the term "vertical" is understood to refer to a direction perpendicular to the plane of the instant top surface of the microelectronic device or substrate.

It is noted that terms such as top, bottom, front, back, over, above, under, and below may be used in this disclosure. These terms should not be construed as limiting the position or orientation of a structure or element, but should be used to provide spatial relationship between structures or elements.

Figure 1A:
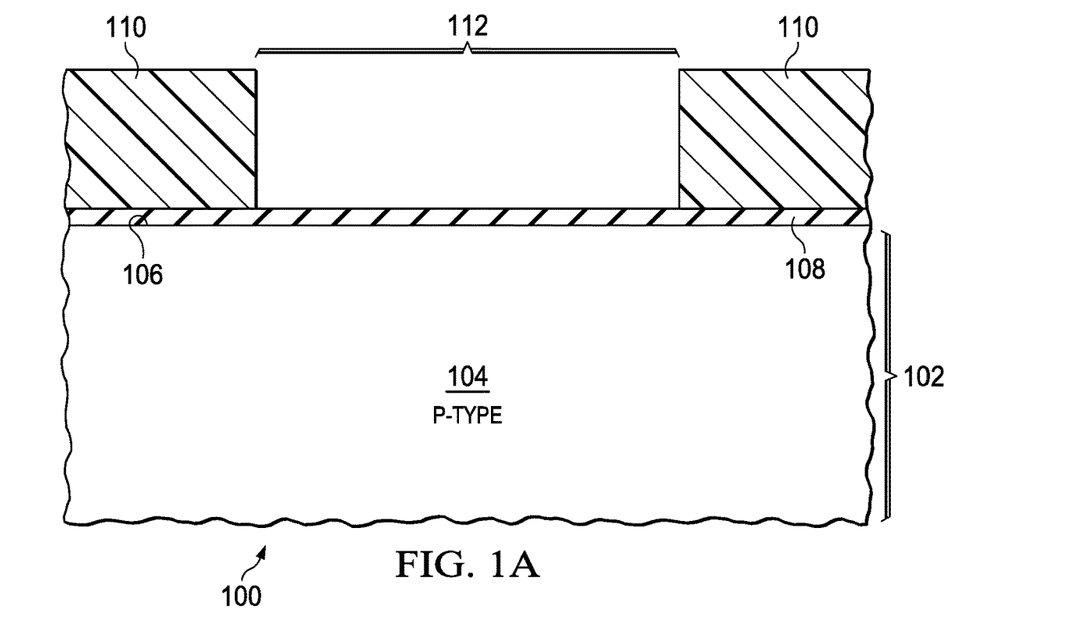
FIGS. 1A through 1M are cross sections of a microelectronic device depicted in stages of an example method of formation.

FIGS. 1A through 1M are cross sections of a microelectronic device depicted in stages of an example method of formation. Referring to FIG. 1A, the microelectronic device 100 includes a substrate 102 having a semiconductor material 104 having a top surface 106. The microelectronic device 100 may be, for example, an integrated circuit or a discrete component. The substrate 102 may include, for example, a bulk silicon wafer, a silicon-on-insulator (SOI) wafer, a silicon wafer with an epitaxial layer, or other substrate suitable for forming the microelectronic device 100. The semiconductor material 104 may include silicon that is doped p-type, for example by boron. The semiconductor material 104 may include silicon of a bulk silicon wafer, may include silicon of an epitaxial layer, or may include silicon of a transfer layer.

A screen layer 108 is formed over the top surface 106 of the semiconductor material 104. The screen layer 108 includes silicon dioxide. The screen layer 108 may have a thickness range of, for example, 6.5 nanometers to 30 nanometers after being formed. Tests have indicated that a screen layer 108 less than 6.5 nanometers thick may not adequately protect the semiconductor material 104 at the top surface 106 during subsequent process steps. Further tests have indicated that a screen layer 108 more than 30 nanometers thick may result in: undesirable variations of sheet resistance in a subsequently-formed n-type buried layer (NBL), low throughput (for example, through an ion implanter used to implant antimony to form the NBL), or hardening of photoresist used to form an implant mask. At least a portion of the screen layer 108 may be formed by thermal oxidation of the silicon in the semiconductor material 104 near the top surface 106. It is recognized that forming the screen layer 108 by a thermal oxidation process consumes silicon at the top surface 106. For the purposes of this disclosure, the top surface 106 will be understood to refer to the instant top surface 106 of the semiconductor material 104 which exists during the step under discussion. The instant top surface 106 may change from step to step during formation of the microelectronic device 100.

An implant mask 110 is formed over the screen layer 108. The implant mask 110 exposes the screen layer 108 in an NBL area 112 and covers the screen layer 108 outside the NBL area 112. The implant mask 110 may include photoresist formed by a photolithographic operation. The implant mask 110 may further include anti-reflection material such as a bottom anti-reflection coating (BARC). The implant mask 110 is sufficiently thick to absorb antimony atoms impacting the implant mask 110 during a subsequent antimony implant process, so as to prevent degradation of performance parameters of the microelectronic device 100. The implant mask 110 is also sufficiently thick to maintain reactivity with oxidizing elements to enable removal of the implant mask 110 without damage to the screen layer 108. For example, the implant mask 110 may be free of inorganic material, because the inorganic material would reduce reactivity with oxidizing elements. In one implementation, the implant mask 110 may be at least 500 nanometers thick to provide these functions. Notwithstanding the aforementioned thickness range, future developments in photoresist formulation and photolithographic processes, as well as future developments in photoresist removal processes, may support a lower thickness range.

Figure 1B:
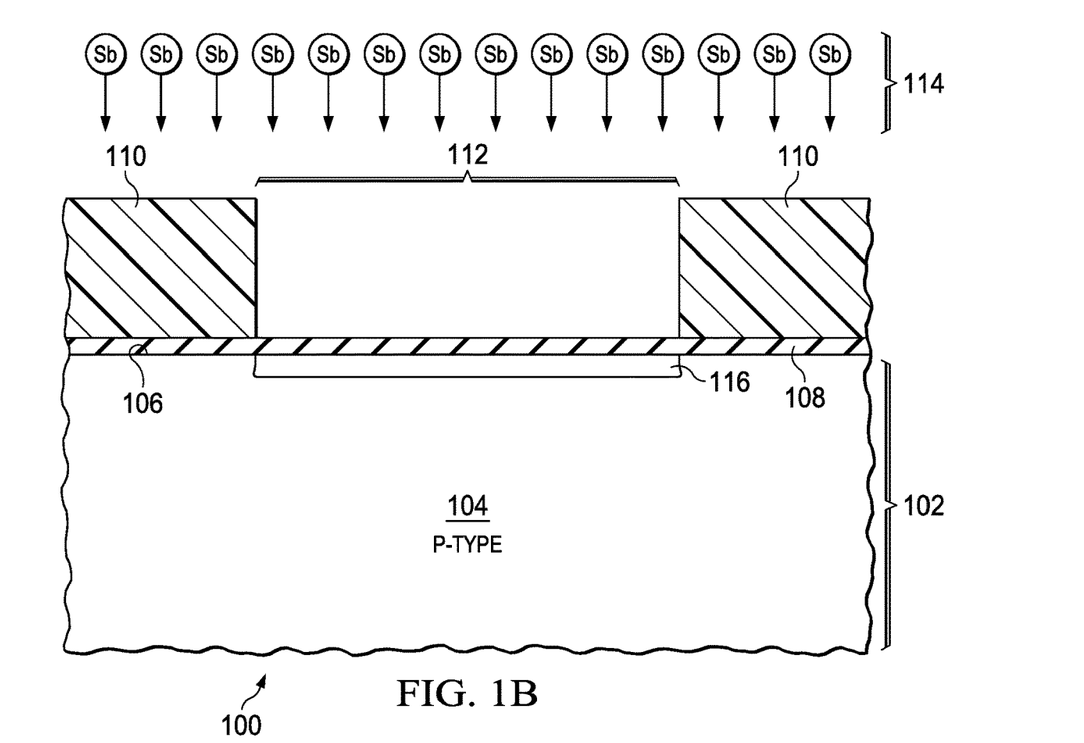

Referring to FIG. 1B, antimony atoms 114 are implanted into the microelectronic device 100. A thickness of the screen layer 108 in the NBL area 112 is equal to the thickness of the screen layer 108 adjacent to the NBL area 112 when implanting of the antimony atoms commences. A majority of the antimony atoms 114 pass through the screen layer 108 to form an implanted region 116 in the NBL area 112 in the semiconductor material 104 under the screen layer 108. A minority of the antimony atoms 114 are absorbed by the screen layer 108. It is desirable to attain a low sheet resistance of the subsequently-formed NBL, for example less than 30 ohms/square to attain circuit performance targets, which may be achieved by a dose of approximately $1 \times 10^{15}$ cm$^{-2}$ or more of the antimony atoms 114 in the semiconductor material 104 to form the implanted region 116. Increasing the fraction of the antimony atoms 114 that form the implanted region 116 by increasing an implant energy of the antimony atoms 114 advantageously improves consistency and reproducibility in a sheet resistance of the subsequently-formed NBL. The implant energy is also a function of considerations of removing the implant mask 110 after the antimony atoms 114 are implanted, and considerations of throughput of the implant equipment. Many high current implanter are limited by a maximum allowable beam power, the beam power being understood as a product of the implant energy, expressed in volts, and beam current, so that increasing the implant energy necessitates reducing the beam current and thus reducing throughput. The antimony atoms 114 may be implanted with sufficient energy to place 60 percent to 85 percent of the antimony atoms 114 through the screen layer 108 and into the semiconductor material 104, which advantageously provides a consistent sheet resistance for the subsequently-formed NBL. The implant energy may be determined by consideration regarding process capability for removing the implant mask 110 after the antimony atoms 114 are implanted. For example, for a version of the instant example in which the screen layer 108 is 15 nanometers to 25 nanometers thick, the antimony atoms 114 may be implanted at a dose of $2 \times 10^{15}$ cm$^{-2}$ and an implant energy of 25 kiloelectron volts (keV) to 50 keV.

Figure 1C:
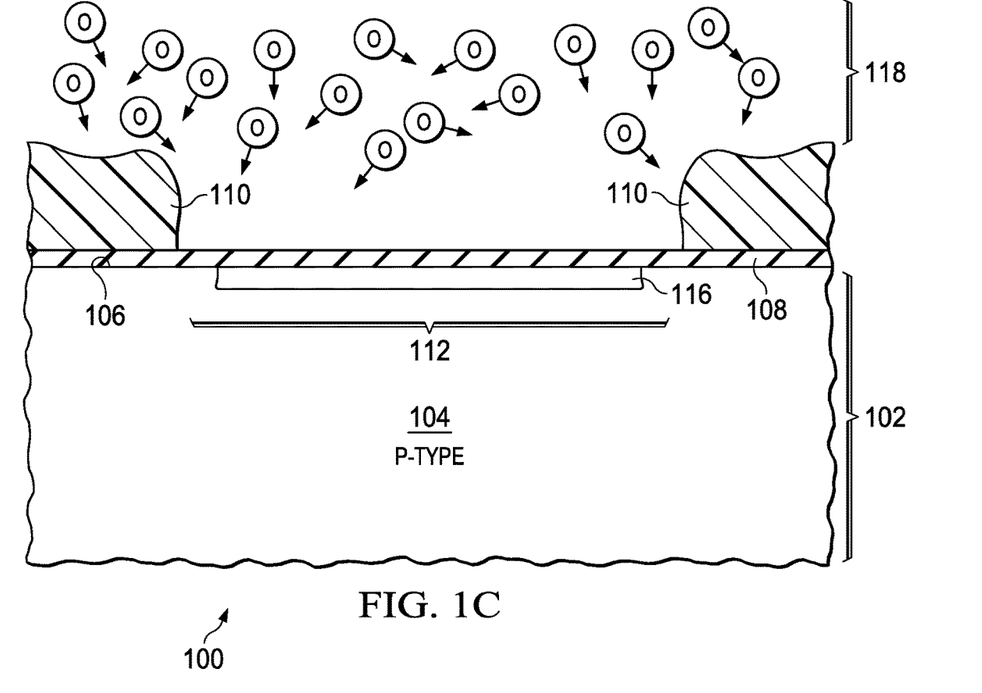

Referring to FIG. 1C, at least a portion of the implant mask 110 may optionally be removed by a dry process using oxygen radicals 118. The oxygen radicals 118 may be provided, for example, by an ash process, a downstream ash process, an ozone process. Parameters of the dry process, such as kinetic energies of the oxygen radicals 118, are selected to avoid unacceptable degradation of the screen layer 108, especially in the NBL area 112.

Figure 1D:
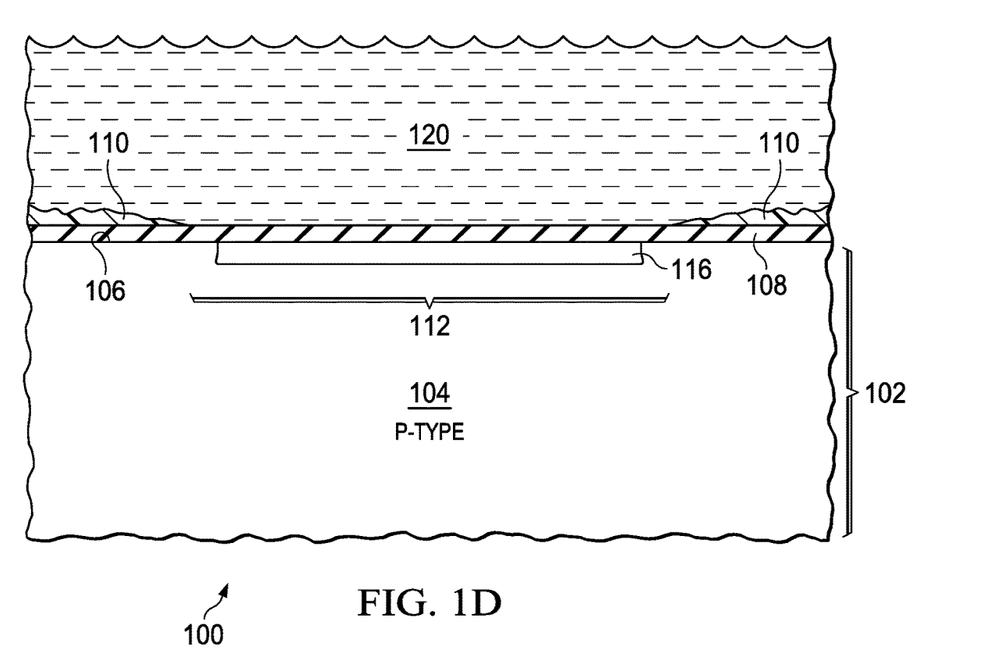

Referring to FIG. 1D, at least a portion of the implant mask 110 may optionally be removed by a wet process 120. The wet process 120 may include, in one example, an aqueous mixture of hydrogen peroxide and sulfuric acid, followed by an aqueous mixture of hydrogen peroxide and ammonium hydroxide. In another example, the wet process 120 may include organic reagents such as sulfonic acid and phenol. The implant mask 110 is completely removed by either the dry process of FIG. 1C, the wet process 120, or a combination of both. A thickness of the screen layer 108 in the NBL area 112 is substantially equal to the thickness of the screen layer 108 adjacent to the NBL area 112 after the implant mask 110 is completely removed, that is, the thickness of the screen layer 108 in the NBL area 112 is equal to the thickness of the screen layer 108 adjacent to the NBL area 112 within measurement tolerances encountered when measuring thickness of oxide layers, for example using ellipsometry, scanning electron microscope (SEM) cross sections, transmission electron microscope (TEM) cross sections, or the like.

Figure 1E:
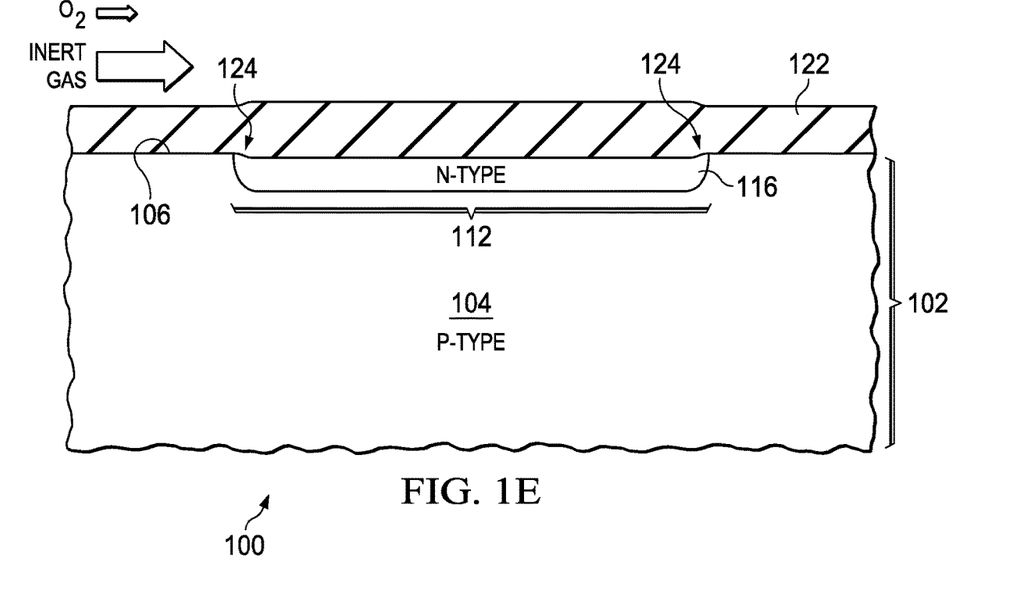

Referring to FIG. 1E, additional silicon dioxide is formed over the top surface 106 of the semiconductor material 104 by a ramp thermal oxidation process to form a diffusion cap layer 122 which includes the screen layer 108 of FIG. 1D and the additional silicon dioxide. The diffusion cap layer 122 may have a thickness range of, for example, 50 nanometers to 65 nanometers thick over the semiconductor material 104 laterally adjacent to the implanted region 116. The ramp thermal oxidation process is part of an anneal/diffusion process which anneals the semiconductor material 104 in the implanted region 116 and diffuses the implanted antimony deeper into the substrate 102. During the ramp thermal oxidation process, the temperature of the substrate 102 is increased from below 500° C. to above 1000° C. The diffusion cap layer 122 reduces loss of the implanted antimony through the top surface 106 of the semiconductor material 104. The silicon in the implanted region 116 of FIG. 1D may be partially amorphous due to the antimony implant. Partially amorphous silicon oxidizes at a higher rate than single-crystal silicon. The additional silicon dioxide may thus form at a higher rate in the implanted region 116 than in the semiconductor material 104 adjacent to the implanted region 116, resulting in a small silicon recess step 124 overlapping a lateral boundary of the NBL area 112. The thermal oxidation process is performed so that the silicon recess step 124 is less than 5 nanometers. This may be accomplished, for example, by having an oxidizing ambient of primarily inert gas, denoted "INERT GAS" in FIG. 1E, such as nitrogen gas ($N_2$), with 2 percent to 10 percent dry oxygen gas ($O_2$), denoted "$O_2$" in FIG. 1E. The oxidizing ambient advantageously has substantially no water vapor ($H_2O$), that is, a concentration of water vapor is less than 1 percent of the concentration of the dry oxygen gas, and may be essentially zero. Water vapor in the oxidizing ambient tends to accentuate the silicon recess step 124, because the water vapor form silicon dioxide at a faster rate than dry oxygen, especially at temperatures below 900° C., while the silicon in the implanted region 116 is still partially amorphous. The ramp thermal oxidation process is performed so that the temperature of the substrate 102 transitions from lower than about 800° C. to higher than about 1000° C. in less than 45 minutes, so as to reduce formation of the additional thermal oxide while the semiconductor material 104 in the implanted region 116 is still amorphous. At temperatures above 1000° C., lattice damage in the semiconductor material 104 from the implanted antimony is repaired, so that formation of the additional silicon dioxide proceeds at more equal rates in the implanted region 116 and in regions of the semiconductor material 104 laterally adjacent to the implanted region 116. Thus, transitioning from about 800° C. to higher than about 1000° C. in less than 45 minutes advantageously reduces formation of the additional silicon oxide in a temperature regime in which the additional silicon oxide is formed at a higher rate in the implanted region 116, compared to ramp thermal oxidation processes having longer times at temperatures between about 800° C. and about 1000° C. A transition time from about 800° C. to about 1000° C. may be determined by considerations of thermal stress damage to the substrate 102. The example of the transition time, less than 45 minutes, applies to substrates of 300 millimeter diameter silicon wafers. Substrates of smaller diameter silicon wafers, such as 200 millimeter diameter wafers, may advantageously use shorter transition times. Larger diameter silicon wafers, such as the anticipated 500 millimeter diameter wafers, may use longer transition times to avoid thermal stress damage.

Figure 1F:
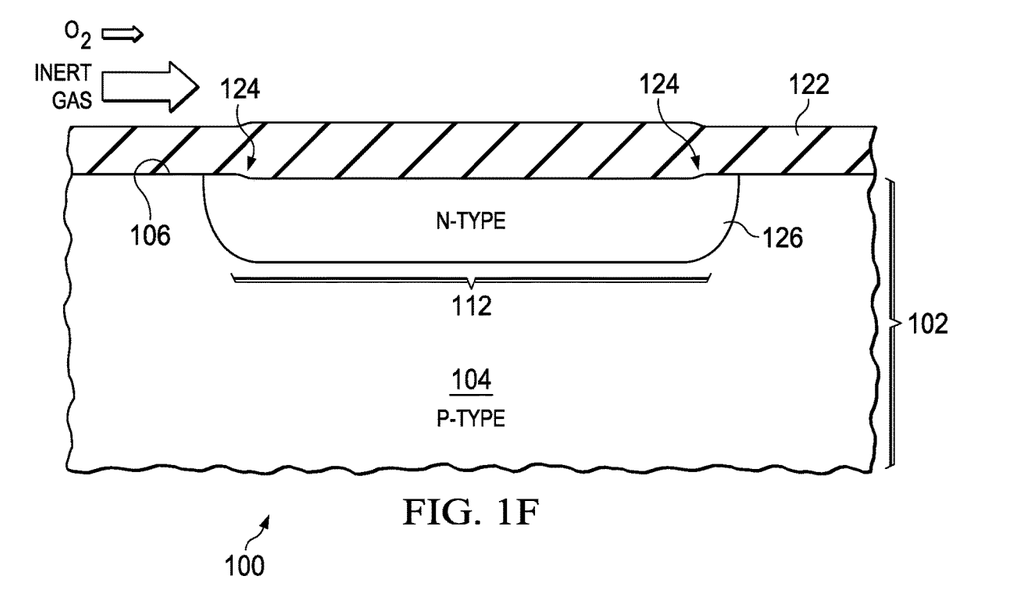

Referring to FIG. 1F, the anneal/diffusion process is continued with the substrate 102 above 1000° C. The implanted antimony in the implanted region 116 of FIG. 1E diffuses deeper into the semiconductor material 104 to form an n-type diffused layer 126. Inert gas, denoted "INERT GAS" in FIG. 1F, such as nitrogen gas, is flowed into an ambient during the instant step. Dry oxygen gas, denoted "$O_2$" in FIG. 1F, may also be flowed into the ambient, and may be discontinued partway through the anneal/diffusion process. The silicon recess step 124 is maintained at less than 5 nanometers during the anneal/diffusion process. An example thermal profile for the anneal/diffusion process may include a time duration of 400 minutes to 500 minutes above 1000° C., of which 250 minutes to 350 minutes are above 1100° C., and 20 minutes to 50 minutes are at approximately 1200° C.

Figure 1G:
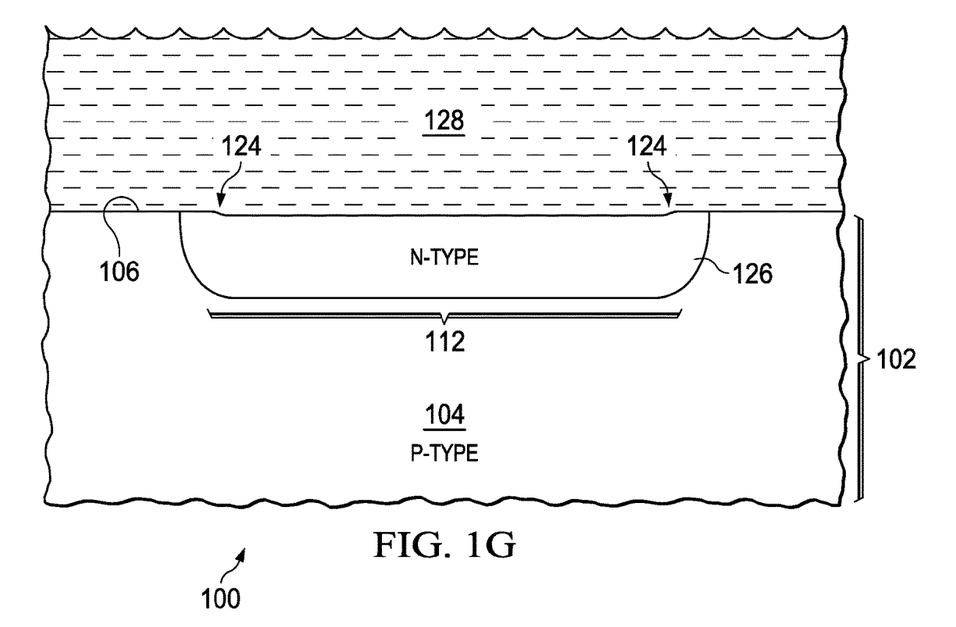

Referring to FIG. 1G, the diffusion cap layer 122 of FIG. 1F is removed in a manner that maintains the silicon recess step 124 at less than 5 nanometers. The diffusion cap layer 122 may be removed, for example, by a wet etch process 128 which includes an aqueous solution of dilute buffered hydrofluoric acid. Other methods of removing the diffusion cap layer 122 are within the scope of the instant example.

Additional implanted regions for other structures, such as a p-type buried layer, may be formed at this time. Such structures may necessitate one or more additional layers of silicon dioxide over the top surface 106 of the semiconductor material 104. These additional layers of silicon dioxide are also removed in a manner that maintains the silicon recess step 124 at less than 5 nanometers. The additional layers of silicon dioxide may be removed in a similar manner as the diffusion cap layer 122 of the instant step.

Figure 1H:
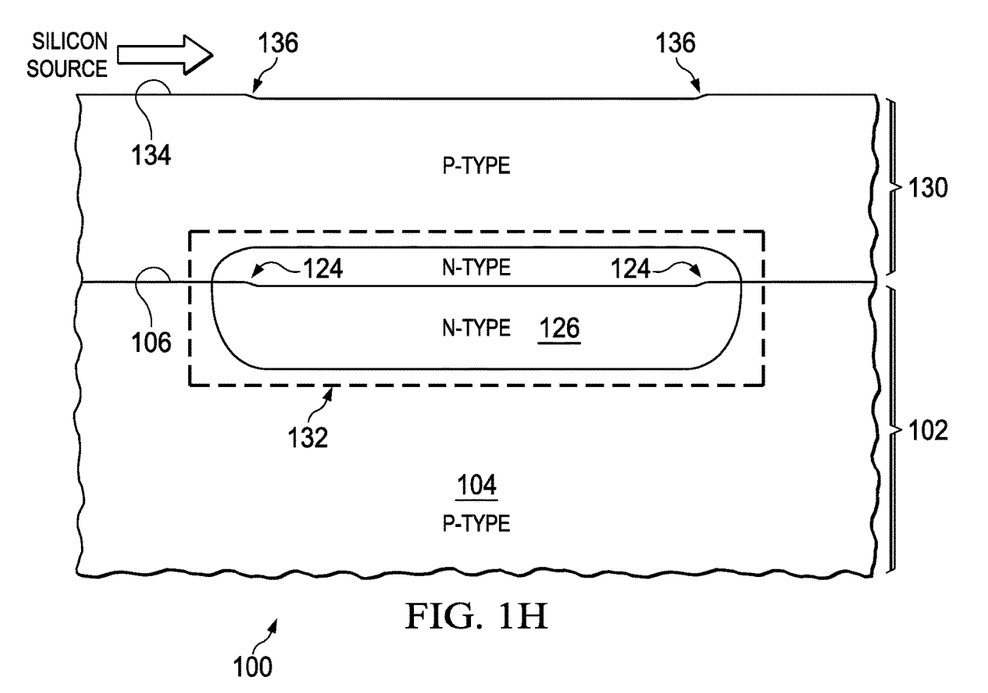

Referring to FIG. 1H, an epitaxial layer 130 of p-type semiconductor material is formed on the top surface 106 of the semiconductor material 104 of the substrate 102. The epitaxial layer 130 may have a similar composition of semiconductor material as the semiconductor material 104 at the top surface 106. For example, both the epitaxial layer 130 and the semiconductor material 104 at the top surface 106 may have crystalline silicon with boron dopant. The epitaxial layer 130 may have a similar dopant density as the semiconductor material 104 at the top surface 106. The epitaxial layer 130 may be formed, for example, by heating the substrate 102 to a temperature of 1000° C. to 1200° C., removing 100 nanometers to 200 nanometers of the semiconductor material 104 at the top surface 106, and subsequently flowing a silicon source, such as silane ($SiH_4$) or disilane ($Si_2H_6$), denoted "SILICON SOURCE" in FIG. 1H, over the substrate 102. Other methods of forming the epitaxial layer 130, such as molecular beam epitaxy, are within the scope of the instant example.

During formation of the epitaxial layer 130, antimony in the n-type diffused layer 126 of FIG. 1G diffuses deeper into the semiconductor material 104 of the substrate 102 and also diffuses upward into the epitaxial layer 130, to form an NBL 132. The NBL 132 does not extend to a top surface 134 of the epitaxial layer 130. The epitaxial layer 130 may have a thickness range of, for example, 3 microns to 10 microns. If the epitaxial layer 130 is less than 3 microns thick, the NBL 132 may extend too close to the top surface 134 to allow subsequently-formed components such as MOS transistors over the NBL 132. If the epitaxial layer 130 is more than 10 microns thick, making an electrical connection to the NBL 132, for example by a heavily doped region known as a sinker, undesirably impacts fabrication cost and complexity of the microelectronic device 100. The NBL 132 advantageously has a sheet resistance less than 30 ohms/square due to the dose of implanted antimony, as disclosed in reference to FIG. 1B.

The silicon recess step 124 in the top surface 106 of the semiconductor material 104 of the substrate 102 may be replicated as a surface recess step 136 in the top surface 134 of the epitaxial layer 130. The surface recess step 136 is advantageously less than 5 nanometers. The surface recess step 136 is located above a lateral perimeter of the NBL 132.

Figure 1I:
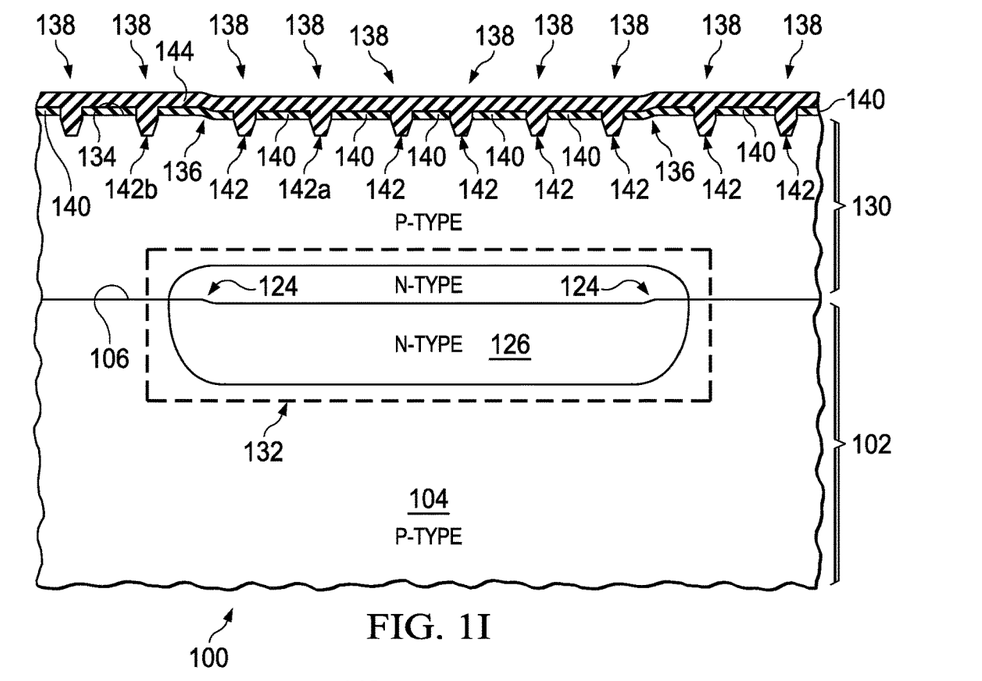

Referring to FIG. 1I, shallow trench isolation (STI) structures 138 are formed in the epitaxial layer 130, extending to the top surface 134. FIG. 1I depicts the STI structures 138 partially completed. The STI structures 138 are formed by forming a chemical mechanical polish (CMP) stop layer 140 over the top surface 134 of the epitaxial layer 130 with openings in the CMP stop layer 140 for the STI structures 138. A first opening in the CMP stop layer 140 is located over the NBL 132 inside the surface recess step 136, and a second opening in the CMP stop layer 140 is located outside the NBL 132. The CMP stop layer 140 may include silicon nitride or such, and may be 100 nanometers to 200 nanometers thick, for example. The CMP stop layer 140 has a uniform thickness over the epitaxial layer 130 directly over the NBL 132 and over the epitaxial layer 130 laterally adjacent to the NBL 132. Trenches 142 are formed in the epitaxial layer 130 in the openings in the CMP stop layer 140, including a first trench 142*a* located over the NBL 132 inside the surface recess step 136, and a second trench 142*b* located outside the NBL 132. A layer of isolation fill material 144 is formed over the CMP stop layer 140 and in the trenches 142. The layer of isolation fill material 144 includes dielectric material such as silicon dioxide or silicon dioxide-based material, and may be formed, for example, by a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a subatmospheric chemical vapor deposition (SACVD) process using dichlorosilane.

Figure 1J:
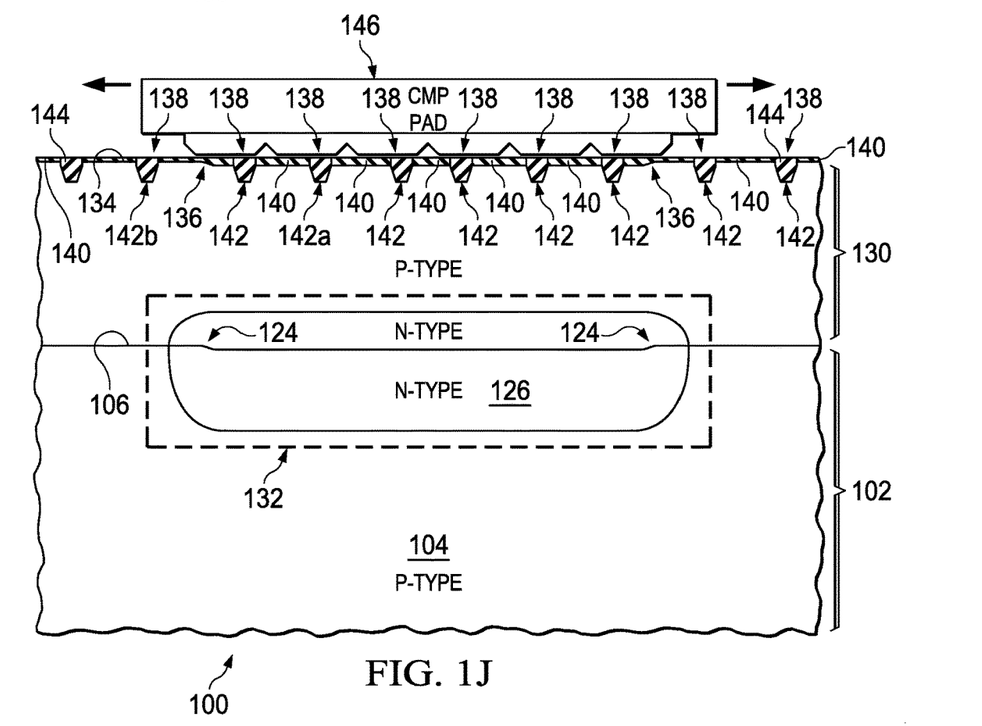

Referring to FIG. 1J, the isolation fill material 144 is removed from over the CMP stop layer 140 by a CMP process, as depicted schematically in FIG. 1J by a CMP pad 146. The CMP process removes a top portion of the CMP stop layer 140 and leaves a bottom portion of the CMP stop layer 140 over the top surface 134 of the epitaxial layer 130. The CMP process leaves a resulting top surface of the CMP stop layer 140 flat across the surface recess step 136, so that the CMP stop layer 140 is thicker on one side of the surface recess step 136 than on an opposite side of the surface recess step 136. Forming the NBL 132 so that the surface recess step 136 is less than 5 nanometers may advantageously provide a desired process latitude for the CMP process. A surface recess step greater than 5 nanometers has been demonstrated to reduce process yield of the CMP process. After the CMP process is completed, the CMP stop layer 140 is removed, leaving the isolation fill material 144 in the trenches 142 to form the STI structures 138.

Figure 1K:
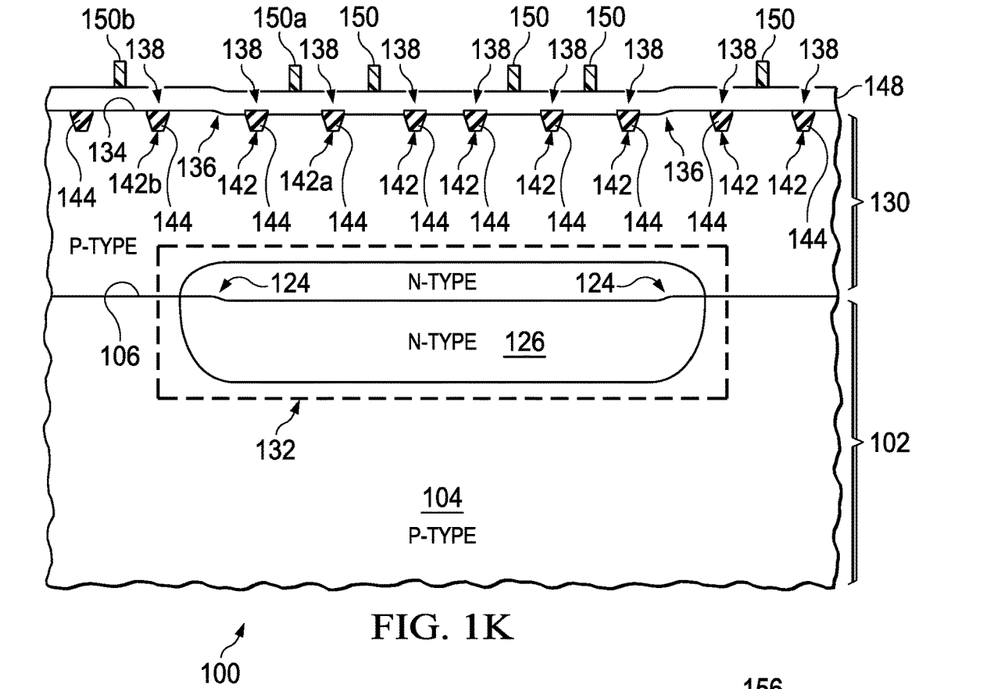

Referring to FIG. 1K, a layer of gate material 148 is formed over the top surface 134 of the epitaxial layer 130 and over the STI structures 138. The layer of gate material 148 may include, for example, polycrystalline silicon, formed by thermal decomposition of silane. The layer of gate material 148 replicates the surface recess step 136, so that a top surface of the layer of gate material 148 over the NBL 132 is lower than the top surface of the layer of gate material 148 outside the NBL 132, by approximately the height of the surface recess step 136, that is, less than 5 nanometers.

A gate etch mask 150 is formed over the layer of gate material 148. The gate etch mask 150 defines areas for subsequently-formed gates of MOS transistors. A first gate mask element 150*a* of the gate etch mask 150 is located over the NBL 132 inside the surface recess step 136, and a second gate mask element 150*b* of the gate etch mask 150 is located outside the NBL 132. Linewidths of the gate etch mask 150 are affected by focus of a photolithographic system used to expose photoresist to form the gate etch mask 150. Maintaining the surface recess step 136 less than 5 nanometers advantageously provides adequate planarity of the top surface of the layer of gate material 148, so that the photoresist over the NBL 132 and the photoresist outside the NBL 132 may be simultaneously in focus during a photolithographic operation which exposes the photoresist, thus providing a desired uniformity of the linewidths over the NBL 132 and outside the NBL 132. This advantage is important for fabricating MOS transistors with gate lengths below 250 nanometers, and becomes more important for fabricating MOS transistors with even shorter gate lengths.

Figure 1L:
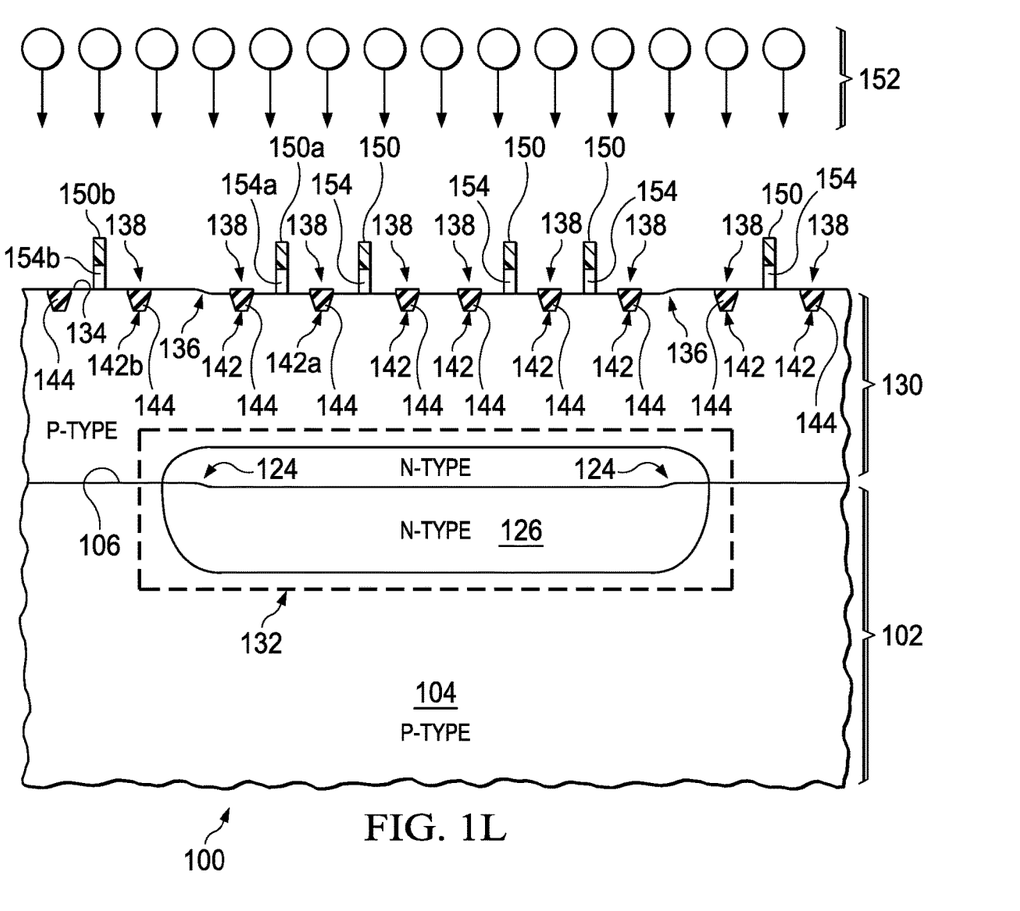

Referring to FIG. 1L, gate material of the layer of gate material 148 of FIG. 1K is removed in areas exposed by the gate etch mask 150 by a gate etch process 152 to form gate structures 154 over the top surface 134 of the epitaxial layer 130. The gate etch process 152 may include a reactive ion etch (RIE) process using halogen radicals such as fluorine radicals or bromine radicals. Uniformity of linewidths of the gate structures 154 produced by the gate etch process 152 are sensitive to local thickness variations of the layer of gate material 148. The local thickness variations are affected by local height differences between the top surface 134 of the epitaxial layer 130 under the gate structures 154 and tops of the isolation fill material 144 in the STI structures 138 immediately adjacent to the corresponding gate structures 154. Instances of the gate structures 154 where the immediately adjacent STI structures 138 have greater height differences tend to have thicker gate material and thus produce wider gates. Maintaining the surface recess step 136 less than 5 nanometers may advantageously provide acceptable linewidth uniformity of the gate structures 154, also known as gate length uniformity or gate critical dimension (CD) uniformity. This advantage is also important for fabricating MOS transistors with gate lengths below 250 nanometers, and becomes more important for fabricating MOS transistors with even shorter gate lengths.

Figure 1M:
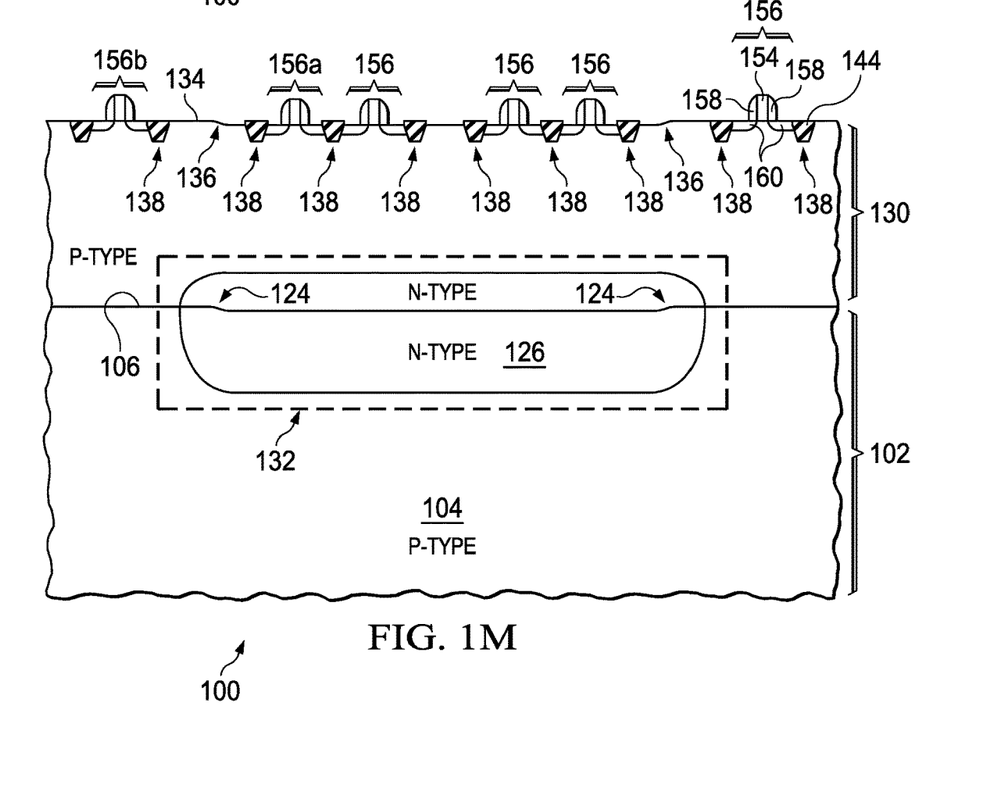

Referring to FIG. 1M, MOS transistors 156 are formed in the microelectronic device 100 incorporating the gate structures 154, including a first MOS transistor 156*a* located over the NBL 132 and inside the surface recess step 136, and a second MOS transistor 156*b* located outside the NBL 132. The MOS transistors 156 include sidewall spacers 158 formed on lateral surfaces of the gate structures 154 and source/drain regions 160 formed in the epitaxial layer 130 adjacent to the gate structures 154. Maintaining the surface recess step 136 less than 5 nanometers may advantageously provide a desired uniformity of performance parameters, such as drive current, of the MOS transistors 156 by providing uniform gate lengths of the gate structures 154.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure.

What is claimed is:

1. A microelectronic device, comprising:
   a substrate comprising a semiconductor material having a top surface, the semiconductor material being p-type and comprising silicon;
   an epitaxial layer located on the top surface of the substrate, the epitaxial layer comprising a p-type semiconductor material comprising silicon; and
   an N-buried layer (NBL) located near a boundary between the substrate and the epitaxial layer, the NBL extending into the substrate and into the epitaxial layer, wherein the epitaxial layer has a surface recess over the NBL, and the surface recess has a maximum non-zero step height no greater than about 5 nanometers.

2. The microelectronic device of claim 1, wherein the surface recess has a maximum step height in a range between about 1 nanometer and about 5 nanometers.

3. The microelectronic device of claim 1, wherein the epitaxial layer has a thickness range between about 3 microns and about 10 microns.

4. The microelectronic device of claim 1, further comprising a first STI structure located in the epitaxial layer over the NBL and a second STI structure located in the epitaxial layer outside the NBL.

5. The microelectronic device of claim 1, further comprising a first MOS transistor located in the epitaxial layer over the NBL and a second MOS transistor located in the epitaxial layer outside the NBL.

6. The microelectronic device of claim 1, wherein the NBL has a first lateral extent parallel to the top surface, and the surface recess has a second lateral extent parallel to the top surface, the second lateral extent being completely surrounded by the the second lateral extent.

7. The microelectronic device of claim 1, wherein the NBL includes antimony dopant.

8. An integrated circuit, comprising:
   a semiconductor layer having a first surface and a first conductivity type;
   a plurality of transistors formed on or over the semiconductor layer;
   a doped buried region having a second conductivity type located within the semiconductor layer;
   a recessed portion of the semiconductor layer located over the doped buried region, the recessed portion having a second surface;
   a surface recess step between the first surface and the second surface, the surface recess step having a non-zero step height less than about 5 nm; and
   a proper subset of the transistors located over the doped buried region.

9. The integrated circuit of claim 8, wherein the surface recess has a step height in a range between about 1 nanometer and about 5 nanometers.

10. The integrated circuit of claim 8, wherein the semiconductor layer includes an epitaxial layer having a thickness range between about 3 microns and about 10 microns.

11. The integrated circuit of claim 8, further comprising a first pair of dielectric isolation structures located in the semiconductor layer over the doped buried region and a second pair of dielectric isolation structures located in the semiconductor layer outside a lateral extent of the doped buried region.

12. The integrated circuit of claim 11, further comprising a first transistor located on or over the semiconductor layer between the first pair of dielectric isolation structures, and a second transistor located on or over the semiconductor layer between the second pair of dielectric isolation structures.

13. The integrated circuit of claim 8, wherein the doped buried region has a first lateral extent parallel to the top surface, and the surface recess has a second lateral extent parallel to the top surface, the first lateral extent being greater than the second lateral extent.

14. The integrated circuit of claim 8, wherein the doped buried region has a first lateral extent parallel to the top surface, and the surface recess has a second lateral extent parallel to the top surface, the second lateral extent being completely within a perimeter of the first lateral extent.

15. The integrated circuit of claim 8, wherein the doped buried region includes antimony dopant.

16. The integrated circuit of claim 8, wherein the first conductivity type is p-type.

* * * * *